United States Patent

Maige et al.

(10) Patent No.: US 9,490,761 B2
(45) Date of Patent: Nov. 8, 2016

(54) DEVICE FOR BALANCING THE RISE AND FALL SLEW-RATES OF AN OPERATIONAL AMPLIFIER

(71) Applicant: STMICROELECTRONICS (GRENOBLE 2) SAS, Grenoble (FR)

(72) Inventors: Philippe Maige, Seyssinet-Pariset (FR); Pawel Fiedorow, Grenoble (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/595,658

(22) Filed: Jan. 13, 2015

(65) Prior Publication Data

US 2015/0200634 A1  Jul. 16, 2015

(30) Foreign Application Priority Data

Jan. 14, 2014 (FR) ..................... 14 50282

(51) Int. Cl.
| | |
|---|---|
| *H03F 1/14* | (2006.01) |
| *H03F 3/45* | (2006.01) |
| *H03F 1/02* | (2006.01) |

(52) U.S. Cl.
CPC ........ *H03F 3/45179* (2013.01); *H03F 1/0261* (2013.01); *H03F 3/45183* (2013.01); *H03F 3/45708* (2013.01); *H03F 2203/45014* (2013.01); *H03F 2203/45066* (2013.01); *H03F 2203/45248* (2013.01); *H03F 2203/45632* (2013.01); *H03F 2203/45674* (2013.01); *Y10T 29/41* (2015.01)

(58) Field of Classification Search
CPC .... H03F 3/3018; H03F 3/303; H03F 3/3052; H03F 2203/45484; H03F 2203/45682; H03F 2203/45356; H03F 2200/234; H03F 2200/264; G06G 7/12; G06G 7/186
USPC ........ 327/91, 263, 309, 310, 564; 330/2, 75, 330/124 R, 127, 151, 207 P, 251–257, 260, 330/263, 264, 292, 293, 298
See application file for complete search history.

(56) References Cited

U.S. PATENT DOCUMENTS

| | | | | |
|---|---|---|---|---|
| 4,250,460 | A | * | 2/1981 | Gasparik ............. H03F 3/45071 330/252 |
| 6,771,126 | B2 | * | 8/2004 | Blankenship ....... H03F 3/45192 330/257 |
| 2004/0051585 | A1 | | 3/2004 | Johnson |

FOREIGN PATENT DOCUMENTS

| | | |
|---|---|---|
| EP | 0459070 A1 | 12/1991 |
| JP | 2003037449 A | 2/2003 |

OTHER PUBLICATIONS

Furth et al: "A 22dB PSRR enhancement in a two-stage CMOS opamp using tail compensation", Custom Integrated Circuits Conference (CICC), 2012 IEEE, IEEE, Sep. 9, 2012 (Sep. 9, 2012), pp. 1-4, XP832263789.

* cited by examiner

*Primary Examiner* — Steven J Mottola
*Assistant Examiner* — Hafizur Rahman
(74) *Attorney, Agent, or Firm* — Allen, Dyer, Doppelt, Milbrath & Gilchrist, P.A.

(57) ABSTRACT

An amplifier includes a pair of transistors connected in a differential stage, and a bias current source connected to a common node of the differential stage. A slew-rate compensation circuit is configured to derive from the common node a dynamic compensation current during a phase in which the voltage of the common node varies.

10 Claims, 1 Drawing Sheet

DEVICE FOR BALANCING THE RISE AND FALL SLEW-RATES OF AN OPERATIONAL AMPLIFIER

FIELD OF THE INVENTION

The invention relates to amplifiers, especially operational amplifiers including a differential input stage.

BACKGROUND

FIG. 1 illustrates a conventional follower configuration of an operational amplifier. The output Vout of the amplifier is applied directly to the inverting input of the amplifier. The input signal Vp is applied to the non-inverting input of the amplifier.

This configuration may be used to process input signals Vp having large dynamics that can substantially reach the supply rail levels of the amplifier. In this situation the amplifier often reaches its slew-rate, i.e. the maximum dV/dt that the amplifier can produce. An input signal having a steeper slope than the slew-rate produces an output signal having a slope limited to the slew-rate.

Conventional operational amplifier structures have different rise and fall slew-rates. As a result, when the slope of the input signal is greater than the slew-rate, the average level of the output signal shifts noticeably compared to the average level of the input signal. This is not desirable in certain applications.

SUMMARY

There is thus a need for balancing the rise and fall slew-rates of an amplifier.

This need is addressed by an amplifier comprising a pair of transistors connected in a differential stage, a bias current source connected to a common node of the differential stage, and a slew-rate compensation circuit configured to derive from the common node a dynamic compensation current during a phase in which the voltage of the common node varies.

The compensation circuit may be configured to replicate the voltage variations of the common node on a capacitor and to generate the compensation current from the current flowing in the capacitor.

The compensation circuit may comprise: a follower transistor of the same type as the transistors of the differential pair, having its control terminal connected to the control terminal of a first transistor of the differential pair, and a first conduction terminal connected to a terminal of the capacitor; and a current mirror having an input connected to the second conduction terminal of the follower transistor, and an output connected to the common node.

The compensation circuit may comprise a current source connected to the first conduction terminal of the follower transistor, and configured to produce a constant current greater than a peak compensation current.

BRIEF DESCRIPTION OF DRAWINGS

Other advantages and features will become more clearly apparent from the following description of particular embodiments of the invention provided for exemplary purposes only and represented in the appended drawings, in which.

DETAILED DESCRIPTION

Figure 1:
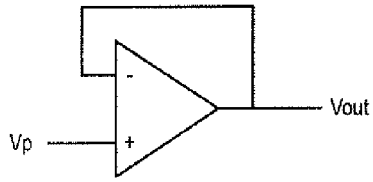
FIG. 1 is a schematic diagram illustrating a known follower circuit based on an operational amplifier according to the prior art.

In the configuration of FIG. 1, the input common-mode of the amplifier, i.e. the average of the voltages applied to its two inputs, follows the input voltage, unlike an inverting configuration in which the common-mode is fixed. The inventors have noticed an offset between the rise and fall slew-rates in configurations of this type, where the common-mode follows the input signal.

Figure 2:
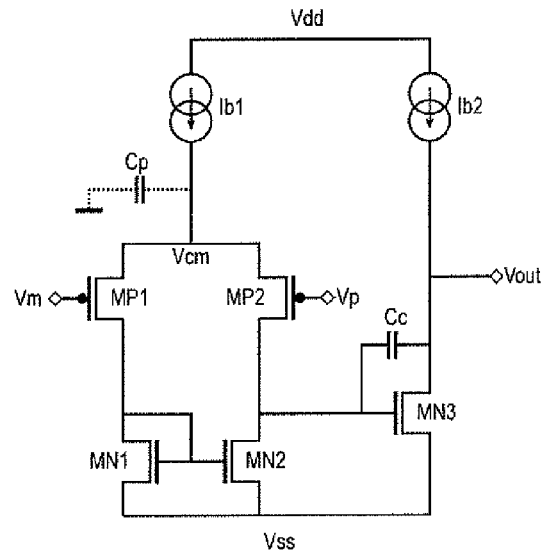
FIG. 2 is a schematic circuit diagram of an operational amplifier according to the prior art.

FIG. 2 is a simplified example of an operational amplifier structure that highlights this behavior. The amplifier comprises a differential stage formed of a pair of transistors MP1, MP2, here P-channel MOS transistors. The sources of transistors MP1 and MP2 are connected to a common node Vcm. A constant current source Ib1 connects the common node Vcm to a positive supply rail Vdd. The drains of the transistors MP1 and MP2 are connected respectively to an input and an output of a current mirror. This current mirror comprises two n-channel MOS transistors MN1 and MN2, whose sources are connected to a negative power supply rail Vss, and whose drains are connected respectively to the drains of the transistors MP1 and MP2. The transistor MN1 is connected as a diode between the gate and the source of transistor MN2.

The output stage of the amplifier comprises an NMOS transistor MN3 connected in common-source configuration to rail Vss. This transistor is controlled by the drain of transistor MP2 and is biased by a current source Ib2 connected between the rail Vdd and the drain of transistor MN3. The output Vout of the amplifier is taken from the drain of transistor MN3. A frequency compensation capacitor Cc may be connected between the drain and the gate of transistor MN3.

With this configuration, the gate of transistor MP1 forms the inverting input Vm of the amplifier, and the gate of transistor MP2 forms the non-inverting input Vp. In an open loop mode, when a deviation appears between the input voltages Vp and Vm, the transistor whose gate is at the lowest voltage becomes more conductive than the other transistor, and derives most of the current Ib1. If transistor MP1 is more conductive, the current is copied into the drain of transistor MN2 and contributes to reducing the conduction of transistor MN3. If transistor MP2 is more conductive, the current contributes to increasing the conduction of transistor MN3.

In a closed loop mode, the amplifier assumes a balance point where the voltages Vp and Vm are substantially equal. In the follower configuration of FIG. 1, the voltages Vp and Vm follow the input voltage (Vp).

In practice, as shown, there is a parasitic capacitance Cp between the common node Vcm and a fixed voltage. The source-bulk capacitances of transistors MP1 and MP2 and the output capacitance of the current source Ib1 contribute significantly to the parasitic capacitance.

Under these conditions, the voltage variation of the common node Vcm, following the common-mode of voltages Vp and Vm, causes the charge or discharge of the capacitance Cp. Hereinafter, a circuit node and the voltage at this node are designated by the same reference.

When the voltage Vcm decreases, the differential stage receives the current Ib1 increased by the discharge current of the capacitance Cp. The differential stage dynamically sees a higher bias current than the quiescent current, which contributes to increase the slew-rate, in particular because the gate capacitance of the transistor MN3 is charged faster.

When the voltage Vcm increases, part of the current Ib1 is used to charge the capacitance Cp and is subtracted from the differential stage. The differential stage dynamically sees a lower bias current than the quiescent current, which contributes to reduce the slew-rate, in particular because the gate capacitance of the transistor MN3 is discharged slower.

Figure 3:
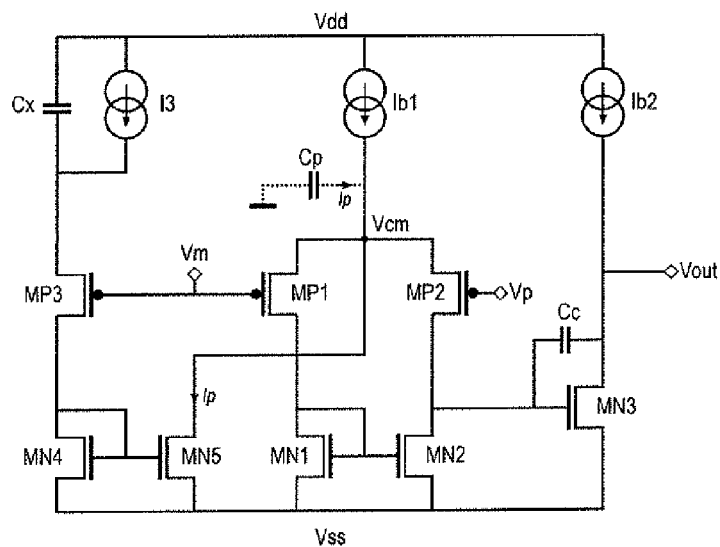
FIG. 3 is a schematic diagram illustrating an embodiment of an operational amplifier including a slew-rate compensation circuit in accordance with features of the present embodiments.

FIG. 3 shows an embodiment of a compensation circuit for balancing the rise and fall slew-rates in an amplifier, e.g. of the type shown in FIG. 2. This circuit is designed to derive from the common node Vcm a dynamic compensation current Ip during the phases where the voltage Vcm changes. The compensation current may be of the same nature as the charging or discharging current of the parasitic capacitance Cp, and may therefore be produced from a capacitor Cx to which the variations of voltage Vcm are applied.

More specifically, in the embodiment of FIG. 3, the variations in voltage Vcm are applied through a follower transistor MP3 whose source is connected to a terminal of capacitor Cx. The other terminal of capacitor Cx is connected to a fixed voltage, for example the power supply rail Vdd. To reproduce the same operating conditions as the differential stage, transistor MP3 is similar (P-channel MOS) to the transistors of the differential stage, and its gate is connected to one of the inputs of the amplifier, for instance the inverting input Vm, formed by the gate of transistor MP1.

The drain of transistor MP3 is connected to the input of a current mirror whose output is connected to node Vcm. Preferably, for transistor MP3 to operate in the same conditions as the transistors MP1 and MP2, this current mirror has the same structure as the mirror MN1, MN2. In this example, it is formed of two transistors MN4 and MN5, of N-channel MOS type, whose sources are connected to the negative power supply rail Vss. The transistor MN4, forming the input of the mirror, is connected as a diode between the gate and the source of transistor MN5. The drain of transistor MN5, forming the output of the mirror, is connected to node Vcm.

With this configuration, when the voltage Vm decreases, causing a decrease in the voltage Vcm, the source voltage of transistor MP3 follows the decrease. Therefore, transistor MP3 tends to charge the capacitor Cx. The charging current is replicated by the current mirror MN4, MN5 on node Vcm.

By a choice of the values of the capacitor Cx and the ratio of mirror MN4, MN5, the compensation current thus drawn from node Vcm may match the parasitic current Ip drawn from the capacitance Cp, whereby only the current Ib1 supplies the differential stage. When the voltage Vm increases, transistor MP3 tends to turn off. The capacitor Cx is not discharged through the transistor MP3, whereby the current in transistor MP3 and the mirror MN4, MN5 cancels. During this phase, the differential stage operates in its native conditions, without the parasitic current compensation. Capacitor Cx may discharge through a resistive element.

To balance the rise and fall slew-rates with this asymmetric operation of the compensation circuit, the capacitor Cx and mirror MN4, MN5 may be sized so that, during the phase when voltage Vcm decreases, the compensation current is greater than the parasitic current. The excess compensation current is then preferably equal to the current drawn by the parasitic capacitance Cp during the phase when the voltage Vcm increases. Under these conditions, the dynamic current supplying the differential stage is slightly lower than the current Ib1 but equal in both phases.

Preferably, as shown, a current source I3 is connected across the capacitor Cx, and configured to produce a constant current greater than a peak value of the compensation current. This current source may be in the form of a P-channel MOS transistor forming the output of a current mirror, like current sources Ib1 and Ib2.

With this configuration, the compensation circuit acts symmetrically in the two variation phases of voltage Vcm. At rest, the current I3 is drawn from node Vcm through the transistor MP3 and mirror MN4, MN5. The differential stage then operates with a quiescent current Ib1-I3. Thus, the current I3 may be chosen to be relatively low compared to the current Ib1, for example less than one tenth of the current Ib1, or at least just above the peak value of the dynamic parasitic current.

The elements MP3, Cx and I3 reproduce the behavior, respectively, of elements MP1, Cp and Ib1. When the voltage Vcm decreases, the compensation current that charges the capacitor Cx is added to the current I3 in the current mirror and compensates the parasitic current Ip that the capacitance Cp adds to the current Ib1-I3 in node Vcm.

When the voltage Vcm increases, the capacitor Cx is discharged through the current source I3, and the discharge current is subtracted from the current I3 in the current mirror. This compensates for the parasitic current that capacitance Cp subtracts from the current Ib1-I3 in node Vcm.

Many variations and modifications of the embodiments described herein will be apparent to the skilled person. For example, the compensation circuit may be adapted to a differential stage formed of N-type MOS transistors by reversing the conductivity types of the transistors. The compensation circuit also operates in bipolar technology. The gate of transistor MP3 could be directly connected to the node Vcm—this would increase the value of the parasitic capacitance, which could be compensated by increasing the value of the capacitor Cx. The capacitor Cx may be formed by the sole source capacitance of transistor MP3.

That which is claimed is:

1. An amplifier comprising:
   a pair of transistors coupled in a differential stage including a common node;
   a bias current source coupled to the common node of the differential stage; and
   a slew-rate compensation circuit configured to derive from the common node a dynamic compensation current during a phase in which a voltage of the common node varies, the slew-rate compensation circuit comprising
   a capacitor configured to replicate voltage variations of the common node on the capacitor and to generate the dynamic compensation current from a current flowing in the capacitor,
   a follower transistor having a control terminal coupled to a control terminal of a first transistor of the differential pair and a first conduction terminal coupled to a terminal of the capacitor, and
   a current mirror having an input coupled to the second conduction terminal of the follower transistor and an output coupled to the common node.

2. The amplifier of claim 1, wherein the slew-rate compensation circuit comprises a current source coupled to the first conduction terminal of the follower transistor, and configured to produce a constant current greater than a peak compensation current.

3. An amplifier comprising:
a pair of transistors coupled at a common node;
a bias current source coupled to the common node;
a capacitor configured to replicate voltage variations of the common node on the capacitor and to generate a compensation current from a current flowing in the capacitor;
a follower transistor having a control terminal coupled to a control terminal of a first transistor of the pair and a first conduction terminal coupled to the capacitor; and
a current mirror having an input coupled to a second conduction terminal of the follower transistor and an output coupled to the common node.

4. The amplifier of claim 3, further comprising a current source coupled to the first conduction terminal of the follower transistor, and configured to produce a constant current greater than a peak compensation current.

5. A method of making an amplifier, the method comprising:
coupling a pair of transistors in a differential stage at a common node;
coupling a bias current source to the common node of the differential stage; and
coupling a slew-rate compensation circuit to the common node to generate a dynamic compensation current during a phase in which a voltage of the common node varies, the slew rate compensation circuit comprising a capacitor, a follower transistor having a control terminal coupled to a control terminal of a first transistor of the pair and a first conduction terminal coupled to the capacitor, and a current mirror having an input coupled to a second conduction terminal of the follower transistor and an output coupled to the common node.

6. The method of claim 5, wherein the capacitor is configured to replicate voltage variations of the common node on the capacitor and to generate the dynamic compensation current from a current flowing in the capacitor.

7. The method of claim 6, wherein the slew-rate compensation circuit comprises a current source coupled to the first conduction terminal of the follower transistor, and configured to produce a constant current greater than a peak compensation current.

8. A method of operating an amplifier comprising a pair of transistors coupled in a differential stage at a common node, a bias current source coupled to the common node of the differential stage, and a slew rate compensation circuit comprising a capacitor, a follower transistor having a control terminal coupled to a control terminal of a first transistor of the pair and a first conduction terminal coupled to the capacitor, and a current mirror having an input coupled to a second conduction terminal of the follower transistor and an output coupled to the common node, the method comprising:
balancing slew rates in the amplifier by generating a dynamic compensation current during a phase in which a voltage of the common node varies using the slew rate compensation circuit.

9. The method of claim 8, the method comprises replicating voltage variations of the common node on the capacitor to generate the dynamic compensation current from a current flowing in the capacitor.

10. The method of claim 9, wherein the slew-rate compensation circuit comprises a current source coupled to the first conduction terminal of the follower transistor; and the method further comprises producing a constant current, with the current source, greater than a peak compensation current.

* * * * *